United States Patent [19]

Kwitkowski et al.

[11] Patent Number: 4,498,056
[45] Date of Patent: Feb. 5, 1985

[54] SIGNAL AMPLIFIER AND INTEGRAL SIGNAL SHUNT ATTENUATOR

[75] Inventors: Peter A. Kwitkowski; David R. Pacholok, both of Elgin, Ill.

[73] Assignee: Motorola, Inc., Schaumburg, Ill.

[21] Appl. No.: 518,232

[22] Filed: Jul. 28, 1983

[51] Int. Cl.³ .............................................. H03F 3/04
[52] U.S. Cl. ...................................... 330/296; 330/51
[58] Field of Search .......................... 330/51, 207, 296

[56] References Cited

U.S. PATENT DOCUMENTS 3,904,977  9/1975  Barsotti ................................. 330/51
4,172,999 10/1979  Leidich ............................... 330/296

Primary Examiner—James B. Mullins
Assistant Examiner—G. Wan
Attorney, Agent, or Firm—F. John Motsinger; Edward M. Roney; James W. Gillman

[57] ABSTRACT

In accordance with the present invention there is provided an amplifier and integral signal shunt attenuator. The amplifier consists of an active amplifying device that is normally biased for signal amplification. The active amplifying device has a characteristic signal transfer impedance between its input and output and a characteristic signal shunt impedance across its input. The amplifier is configured such that the power dissipated by the active amplifying device may be limited. During transmission standby, the active amplifying device may be rebiased to lower the shunt impedance with respect to the transfer impedance. Thus, the undesirable signal is no longer fed-through the transfer impedance but is substantially shunted across the relatively low shunt impedance.

15 Claims, 1 Drawing Figure

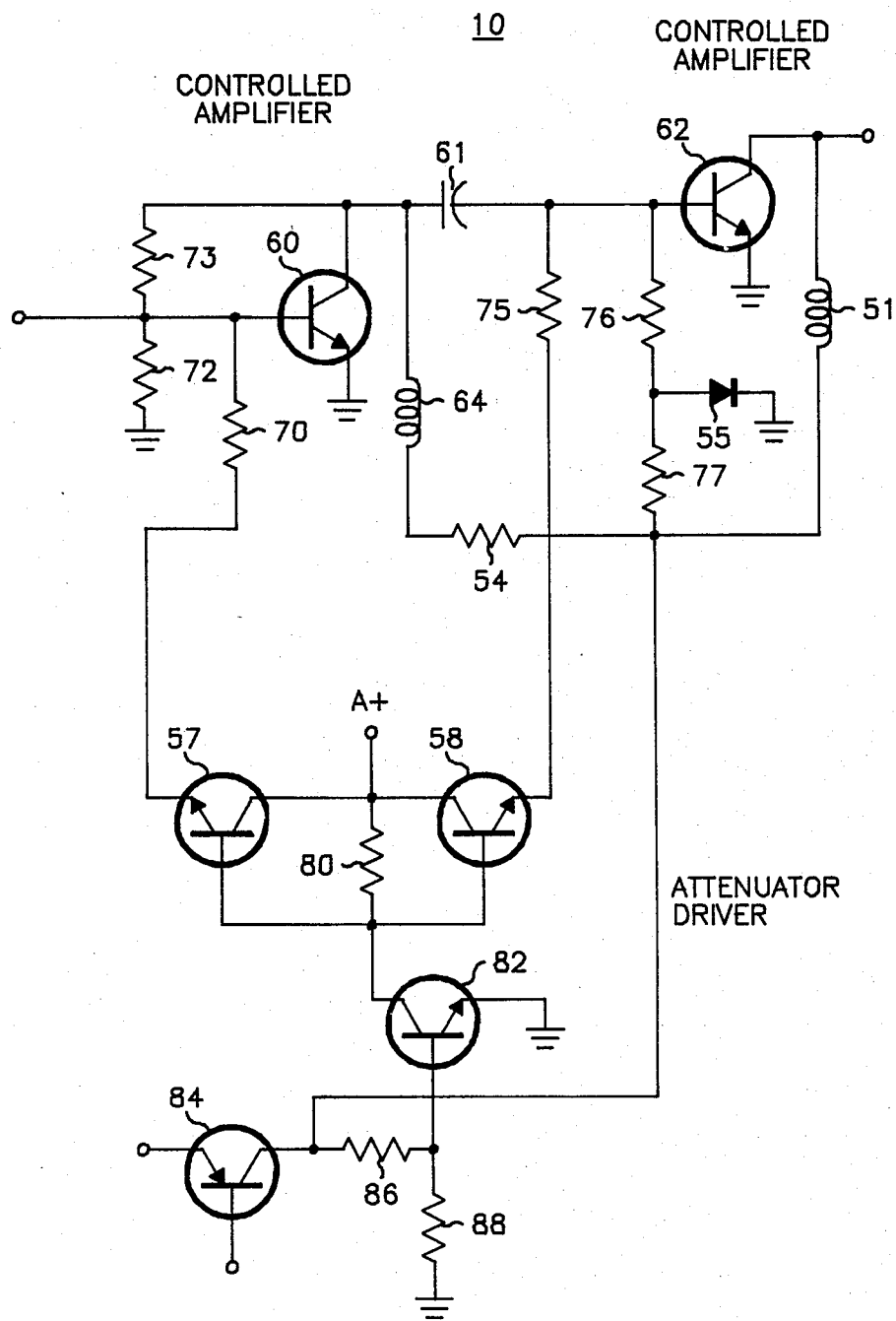

SIGNAL AMPLIFIER AND INTEGRAL SIGNAL SHUNT ATTENUATOR

THE FIELD OF INVENTION

This invention relates to ways of suppressing undesirable signal feed-through during the standby state in radio transmitters. More particularly, this invention is a simple, yet effective, solution to the problem of RF carrier feed-through during the standby state in synthesized radio transmitters.

BACKGROUND OF THE INVENTION

The design of high performance radio frequency (RF) transmitters may use phase-locked frequency synthesizers that experience transmission delays of hundreds of milliseconds to lock onto the desired transmit frequency when the transmitter is turned on.

The delay problem may be solved by leaving the RF frequency generator running continuously, rather than intermittently turning it on and off. With the frequency generator running continuously, the transmitter remains phase-locked upon the proper RF frequency. Thus, the proper RF carrier frequency is always available for instantaneous transmission. However, leaving the RF generator running continuously has its own attendant problems.

One of the problems experienced in leaving the RF generator running is the existence of undesirable signal feed-through. Unwanted signal propagation, such as feed-through, is generally controlled through the amplifying stage by turning off the active amplifying device. Various methods for disabling the active amplifying device include removal of collector voltage, removal of base bias voltage, reverse biasing the base-emitter junction, or simply removing the input signal, in class C amplifiers. However, during the standby state in a radio transmitter, parasitic capacitances of bipolar amplifying devices result in the coupling of significant amounts of RF energy between the inputs and outputs of amplifier stages. In common-emitter amplifier stages, parasitic collector-base capacitance allows significant coupling of energy between the input and output, resulting in undesirable signal feed-through.

Other methods to stop unwanted signal propagation may involve the use of relays or diodes to short or open circuit the input or output of amplifier stages.

A conventional solution to the signal feed-through problem is to shunt undesirable signals by using PIN diodes. Disadvantageously, the PIN diodes require separate biasing networks. While a transmitter is actively transmitting, the shunt PIN diode is biased to present a relatively high impedance. During standby, the PIN diode is rebiased to present a low impedance, thereby shunting undesirable signals.

All of these previous methods for improving feed-through attenuation use devices external to the active amplifying devices themselves. Each external device utilized has its own negative attributes such as additional cost, signal losses, energy losses, and additional components for impedance matching.

It is an object of the present invention to provide a simple, yet effective, solution for the problem of undesirable signal feed-through in RF amplifier stages.

It is an object of the present invention to minimize the number of external devices utilized for attenuating undesirable signals.

It is a further object of the invention to minimize the number of components required and their associated cost, signal losses, and energy losses.

The ultimate object of the invention is to provide greatly improved feed-through attenuation by utilizing the active amplifying device itself as the attenuator.

These and other objectives are accomplished by the present invention.

SUMMARY OF THE INVENTION

In accordance with the present invention there is provided an amplifier and an integral signal shunt attenuator. The amplifier consists of an amplifying device that is normally biased for signal amplification. The amplifying device has a characteristic signal transfer impedance between its input and output and a characteristic signal shunt impedance across its input. The amplifier is configured such that the power dissipated by the active amplifying device may be limited by disabling its amplifying function. During transmission standby, the active amplifying device may be rebiased to lower the shunt impedance with respect to the transfer impedance. Thus, the undesirable signal is no longer fed-through the transfer impedance but is substantially shunted across the relatively low shunt impedance.

It can be seen that the well known inverse relationship between DC current through and the impedance of a semiconductor junction has been creatively used to provide a signal amplifier and integral signal shunt attenuator utilizing a single active device for the amplification of desirable signals as well as using the same device for the attenuation of undesirable signals.

BRIEF DESCRIPTION OF THE DRAWINGS

Additional objects, features, and advantages of an RF circuit apparatus in accordance with the present invention will be apparent from the following detailed description taken together with the accompanying drawing in which:

The single FIGURE is a schematic circuit diagram illustrating a dual stage RF amplifier which incorporates the present invention.

DESCRIPTION OF THE PREFERRED EMBODIMENT

The single FIGURE illustrates a dual stage, variable gain RF amplifier, generally designated 10, which incorporates the present invention. Radio frequency signals are input to the base of, and amplified by, transistor 60. The amplified signal is taken from the collecter of transistor 60 and input through a coupling capacitor 61 to the base of transistor 62 where it is amplified and then applied to later stages (not shown). Resistors 54, 73 and 72 represent conventional biasing for transistor 60. Likewise, resistors 76 and 77 and diode 55 represent conventional biasing for transistor 62. Devices 64 and 51 are elements for decoupling the RF energy from the DC voltages. One skilled in the art will appreciate the need for additional bypass devices and impedance matching elements between stages.

The overall gain of the RF amplifier 10 is controlled by controlling the current at the base of transistor 84. In turn, the base current controls the collector current. The collector current of transistor 84 establishes the voltage across resistors 86 and 88. That voltage is also the supply voltage to the collectors of transistors 60 and 62. The overall gain of the RF amplifier 10 is determined by the collector voltages of transistors 60 and 62.

Therefore, the overall gain is controlled by the base current of transistor 84.

During transmission standby, transistor 84 is turned off. As transistor 84 is turned off, the current through resistors 86 and 88 decreases to zero. Simultaneously, the non-conduction of transistor 84 removes the collector voltage from transistors 60 and 62, as discussed above. Further, the current through the collector of transistor 60 is limited through resistor 54. This limits the power that may be dissipated by the device by disabling the amplifying function of the device. When the current through resistor 88 drops below a certain point, transistor 82 turns off and stops conducting. The current which transistor 82 was sinking through resistor 80 now forward biases transistors 57 and 58 and causes current to be applied to the bases of transistors 60 and 62. When transistors 57 and 58 conduct, current flows through resistors 70 and 75 into the bases of transistors 60 and 62. These currents heavily forward bias the base-emitter junctions of transistors 60 and 62, respectively. These injected currents cause the base-emitter impedances of transistors 60 and 62 to decrease to a low value, as is well known from the inverse relationship between current and the impedance of a semiconductor junction. Accordingly, undesirable signals received by the amplifier stages during standby are shunted across the low impedance of the base-emitter junctions of transistors 60 and 62 and are not permitted to be coupled through the collector-base capacitance of the respective transistors.

Thus, a signal amplifier and integral signal shunt attenuator has been provided utilizing a single active device for the amplification of desirable signals as well as using the same device for the attenuation of undesirable signals.

One skilled in the art will appreciate that many junction devices, such as junction field effect transistors, diodes or differently configured bipolar transistors, may be used for active amplification.

The foregoing description of the preferred embodiment is illustrative of the broad inventive concept comprehended by the invention and has been given for clarity of understanding. However, it is not intended to cover all changes and modifications which do not constitute departures from the spirit and scope of the invention.

What we claim and desire to secure by Letters Patent is:

1. An amplifier and integral signal shunt attenuator, comprising:
   an amplifying device normally biased for signal amplification having means for inputting a signal and means for outputting an amplified signal, having a signal transfer impedance between the input and output means, and having a signal shunt impedance across the input means;
   means for disabling the amplifying function of the device; and
   means for rebiasing the device,
   whereby the device may be rebiased to lower the shunt impedance with respect to the transfer impedance such that an undesirable signal may no longer be fed-through the transfer impedance but may be substantially shunted across the relatively low shunt impedance.

2. A signal shunt attenuator as claimed in claim 1 wherein the normally biased device further comprises:
   a semiconductor device having a semiconductor junction in shunt with the signal input means.

3. A signal shunt attenuator as claimed in claim 2 wherein the rebiasing means further comprises:
   means for heavily forward biasing the shunt semiconductor junction.

4. A signal shunt attenuator as claimed in claim 2 wherein the semiconductor device further comprises:
   one from the group of junction semiconductor devices including bipolar transistors, junction field effect transistors, and diodes.

5. A signal shunt attenuator as claimed in claim 1 wherein the amplification disabling means further comprises:
   means for removing the supply voltage applied to the device.

6. A signal shunt attenuator as claimed in claim 5 wherein the voltage removal means further comprises:
   means for removing the collector voltage.

7. A signal shunt attenuator as claimed in claim 1 wherein the amplification disabling means further comprises:
   means for limiting the amplifier current supply.

8. A signal shunt attenuator as claimed in claim 7 wherein the current limiting means further comprises:
   means for limiting collector current.

9. A signal shunt attenuator as claimed in claim 8 wherein the collector current limiting means further comprises:
   a collector resistor.

10. A signal shunt attenuator as claimed in claim 1 wherein the normally biased device further comprises:
    a normally biased bipolar transistor configured as a common-emitter amplifier.

11. A method for shunting undesirable signal feed-through in an amplifier comprising:
    biasing an amplifying device for normal signal amplification, the device having a signal transfer impedance and a signal shunt impedance;
    disabling the amplifying function of the device; and
    rebiasing the device such that the shunt impedance becomes relatively low with respect to the transfer impedance,
    whereby an undesirable signal may no longer be fed-through the transfer impedance but may be substantially shunted across the relatively low shunt impedance.

12. A shunting method as claimed in claim 11 wherein the step of normally biasing a device further comprises:
    biasing a semiconductor junction in shunt with the signal.

13. A shunting method as claimed in claim 12 wherein the rebiasing step further comprises:
    heavily forward biasing the shunt semiconductor junction.

14. A shunting method as claimed in claim 11 wherein the amplification disabling step further comprises:
    removing the amplifier supply voltage.

15. A shunting method as claimed in claim 11 wherein the amplification disabling step further comprises:
    limiting the amplifier current supply.

* * * * *